United States Patent [19]

Scharrer et al.

[11] Patent Number: 4,833,648
[45] Date of Patent: May 23, 1989

[54] MULTIPORT RAM HYBRID MEMORY CELL WITH FAST WRITE

[75] Inventors: Carl J. Scharrer; Roland H. Pang, both of Plano, Tex.

[73] Assignee: Texas Instruments Incorporated, Dallas, Tex.

[21] Appl. No.: 69,341

[22] Filed: Jul. 2, 1987

[51] Int. Cl.⁴ .............................................. G11C 7/00
[52] U.S. Cl. ............................. 365/189.05; 365/154; 365/230.05
[58] Field of Search ............... 365/189, 230, 181, 233, 365/154, 156, 190

[56] References Cited

U.S. PATENT DOCUMENTS 4,535,428  8/1985  Furman ............................... 365/230
4,719,596  1/1988  Bernstein et al. ................... 365/189

Primary Examiner—Joseph A. Popek
Attorney, Agent, or Firm—George L. Craig; James T. Comfort; Melvin Sharp

[57] ABSTRACT

A fast write CMOS memory cell includes two CMOS inverters connected in a latched configuration with the first CMOS inverter having a P-channel transistor (98) and an N-channel transistor (102) and the second inverter having a P-channel transistor (90) and an N-channel transistor (96). The output of the first inverter is connected to the input of the second inverter with the output of the second inverter connected to the input of the first inverter through a pass transistor (104). The pass transistor (104) is conductive during the static mode of operation and is nonconductive during the write operation. During write, the input of the first inverter is forced to a predetermined logic state with the pass transistor (104) nonconductive. After write, the pass transistor (104) conducts and reconfigures the latch.

12 Claims, 2 Drawing Sheets

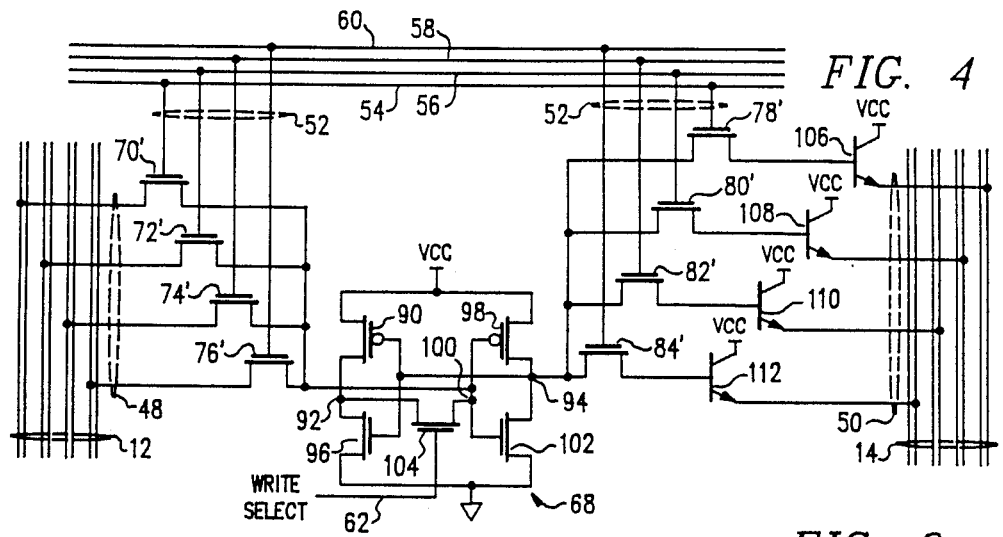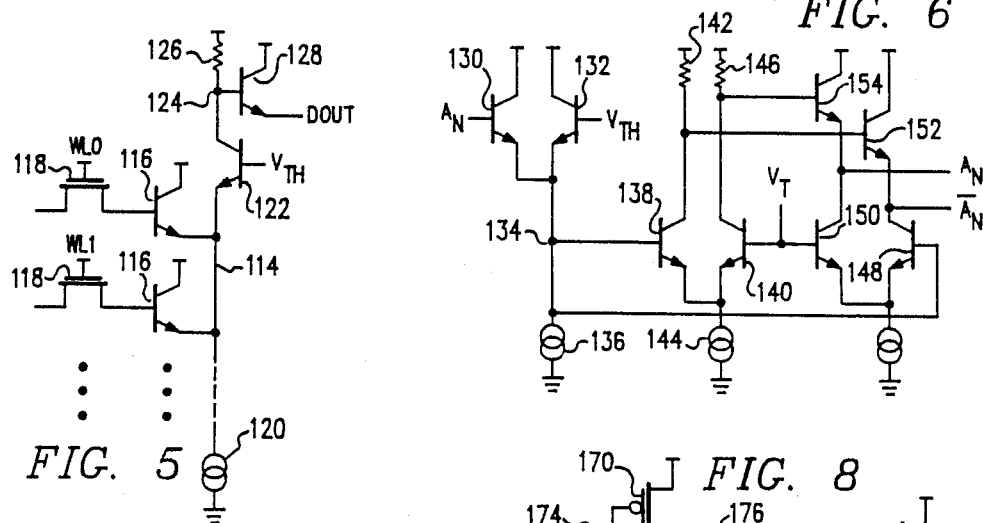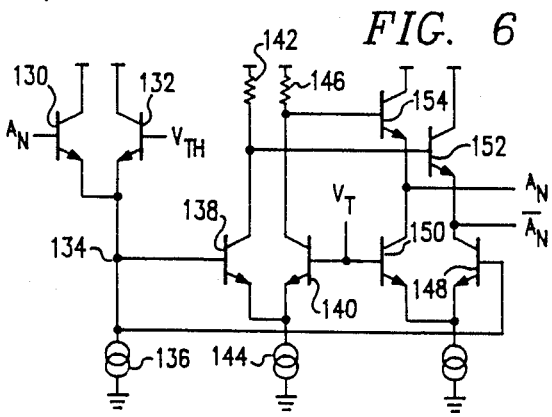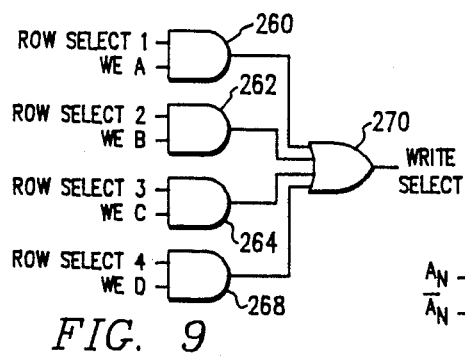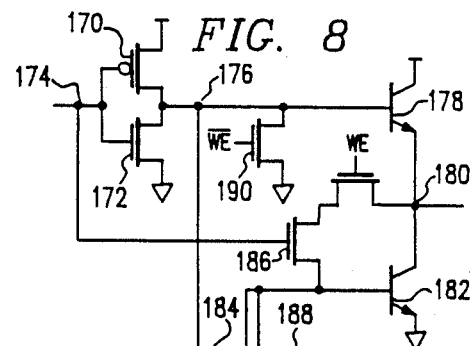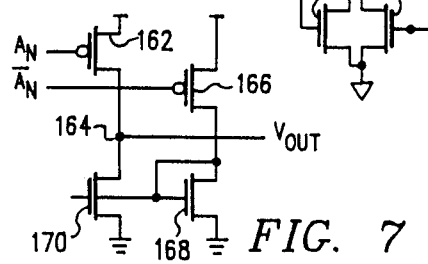

MULTIPORT RAM HYBRID MEMORY CELL WITH FAST WRITE

CROSS REFERENCE TO RELATED APPLICATIONS

This application is related to U.S. patent application Ser. No. 045,981, filed May 1, 1987.

BACKGROUND OF THE INVENTION

Random access memories (RAM) can be of the static type (SRAM) or of the dynamic type (DRAM). In the DRAM, power is minimized by storing a charge on a capacitor and continually refreshing this charge. This charge determines the logic state stored in the capacitor memory cell. In a static type bipolar RAM, a logic bit is stored in a latch, and the state of the latch is maintained by continually drawing current through the latch. As the number of memory cells in the memory increases, this current also increases, as compared to the dynamic type RAM.

There are a number of technologies that have been utilized to realize an SRAM. Either MOS technology can be utilized in the form of CMOS, PMOS or NMOS or bipolar technology can be utilized. When utilizing MOS technology with field effect transistors, charge is typically stored on the gates of the transistors in the associated capacitance. This technology, although providing low power consumption, does have some disadvantages in that it is difficult to drive large capacitive loads with MOS transistors. Further, switching speeds are relatively slow as the MOS transistors have a non-linear resistive driving characteristic. In bipolar technology, the transistors have a higher transconductance, thus providing inherently faster operation due to the lower source impedance. One bipolar technology is Emitter Coupled Logic (ECL) which is a current mode logic and provides very low voltage swings, a low speed-power product, and power consumption which is independent of operating frequency.

ECL logic gates and associated storage latches are formed by providing a current source which is selectively connected to various current paths through transistors configured as emitter followers. Current is switched between the various paths in response to a voltage applied to the base of selected transistors. When realizing an SRAM in ECL technology, a latch is incorporated as a memory element in combination with Write logic gates to current switch the latch, and current sensing gates to perform a Read function. Typically, each latch has one or more current sources associated therewith that maintain a static current at all times. The current requirements therefore increase as the number of memory elements increases. This can result in power dissipation as high as two to five watts for a single memory chip.

To accommodate the increasing density of ECL SRAMs, new package technologies have evolved to dissipate the heat. These new packages represent increased product cost at the silicon level which is compounded by cooling costs at the system level. There exists a need for technology that provides increased density without an increased power consumption.

SUMMARY OF THE INVENTION

The present invention disclosed and claimed herein comprises a CMOS memory cell having first and second inverters. The first inverter has the output thereof connected to the input of the second inverter with the output of the second inverter selectively connectable to the input of the first inverter. In static operation, the output of the second inverter is connected to the input of the first inverter to provide a latched state. When data is written to the memory, the output of the second inverter is disconnected from the input of the first inverter and the input of the first inverter forced to a predetermined logic state. That is, when the Write select signal is present, the pass transistor is non-conducting. Thereafter, the output of the second inverter is connected to the input of the first inverter to provide the static mode of operation.

In a further embodiment of the present invention, a semiconductor memory is provided using the CMOS latch which includes an array of the memory cells utilizing a CMOS latch for each of the memory cells in the array. Address circuitry is provided for receiving an external address for decoding thereof and generation of a row select signal for selecting one row of the memory cells. Read circuitry is provided for interfacing with each of the cells for accessing the information stored in the cells for output therefrom. The read circuitry utilizes a low source impedance for driving an output column line to provide an ECL compatible output voltage. Write circuitry is provided for receiving an ECL compatible input data signal for selectively writing into the cell on a Write column line.

A technical advantage is provided by the present invention by isolating the output of one CMOS inverter in a CMOS latch when writing to the memory cells such that only the high impedance input is driven. This reduces the current drive through the Write circuitry, thus minimizing the size of the transistors utilized in the Write circuitry for coupling the data signal to the memory cell.

BRIEF DESCRIPTION OF THE DRAWINGS

For a more complete understanding of the present invention and the advantages thereof, reference is now made to the following description taken in conjunction with the accompanying Drawings in which:

FIG. 4 illustrates a detailed schematic of the CMOS latch with the multiport input and output buffers;

FIG. 5 illustrates a schematic of a current sense amp;

FIG. 6 illustrates a detailed schematic diagram of an input ECL buffer;

FIG. 7 illustrates a schematic diagram of an ECL to CMOS translator;

FIG. 8 illustrates a schematic diagram of a three state write buffer; and

FIG. 9 illustrates a logic diagram for the write select logic.

DETAILED DESCRIPTION OF THE INVENTION

Figure 1:
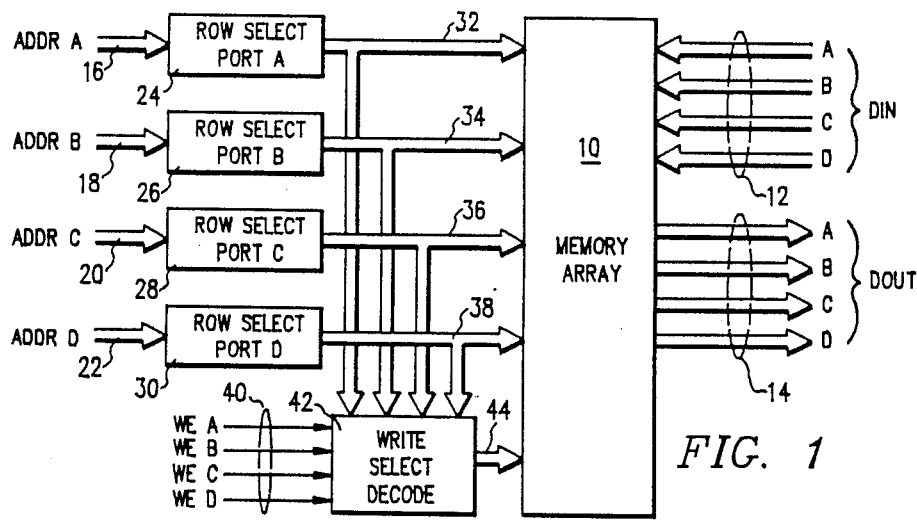
FIG. 1 illustrates a block diagram of the multiport memory.

Referring now to FIG. 1 there is illustrated a schematic block diagram of a multiport memory. The memory includes a memory array 10 which is comprised of a plurality of memory elements arranged in rows and columns. In the preferred embodiment, the memory elements in each row comprise a single word with each memory element in the row comprising a single logic bit of the word with multiple rows selectable for both reading and writing thereto. This is a random access memory array allowing selective access of any row in the memory array 10 for output therefrom on one of multiple output ports.

The memory array 10 is interfaced with four input data buses 12, each interfaced with a separate port A, B, C and D and comprises the data input DIN. The memory array 10 is also interfaced with four output data buses 14, each interfaced with an output port A, B, C, D and constituting the data output DOUT. Each of the input data buses 12 and the output data buses 14 is comprised of an eighteen bit wide data bus which corresponds to an eighteen bit wide data word. The memory array 10 is therefore arranged as an eighteen bit wide memory.

The memory of FIG. 1 has four input address buses 16, 18, 20 and 22 for receiving address inputs ADD A, ADD B, ADD C and ADD D. The address ADD A is a six-bit address which is input to a Row Select Port A decoder 24 which is a one of sixty-four decoder. In a similar manner, the addresses ADD B, ADD C and ADD D are each six-bit addresses which are input on the respective buses 18, 20 and 22 to decoders 26, 28 and 30. Each of the decoders 26–30 comprise a one of sixty four decoder. The decoder 24 is input into the memory array through a group of sixty-four address lines 32 with decoders 26, 28 and 30 being similarly input into the memory array 10 through groups of address lines 34, 36 and 38, respectively. Each of the groups of address lines 32–38 are mutually exclusive such that only one address line in each of the groups 32–38 is selected at any one time. Four separate addresses can be received and four separate rows can be accessed in the memory array 10.

Write Enable signals are input to the memory on four Write Enable lines 40. The Write Enable signals are WE A, WE B, WE C and WE D, one associated with each of the ports A, B, C and D, respectively. The Write Enable lines 40 are input to a Write Select Decode circuit 42 which is also interfaced to the address lines 32–38. The Write Select Decode circuit 42 is operable to selectively determine whether the addressed memory elements are to have data written over the previously stored data. The Write Select Decode circuit 42 is interfaced with the memory array 10 through a group of Write Select lines 44.

In operation, the address ADD A determines which row in the memory array 10 is accessed for output on port A of the DOUT buses 14. If the Write Enable signal WE A on lines 40 is also activated, this allows data on port A of the DIN buses 12 to be written into the accessed row of memory elements. It is possible that all four addresses ADD A, ADD B, ADD C and ADD D are identical and select the same row for output on all four ports A, B, C and D of the DOUT buses 14. Although undesirable, it is possible to interface the data on the DIN buses 12 with an accessed row of memory elements. This normally would not occur.

Figure 2:
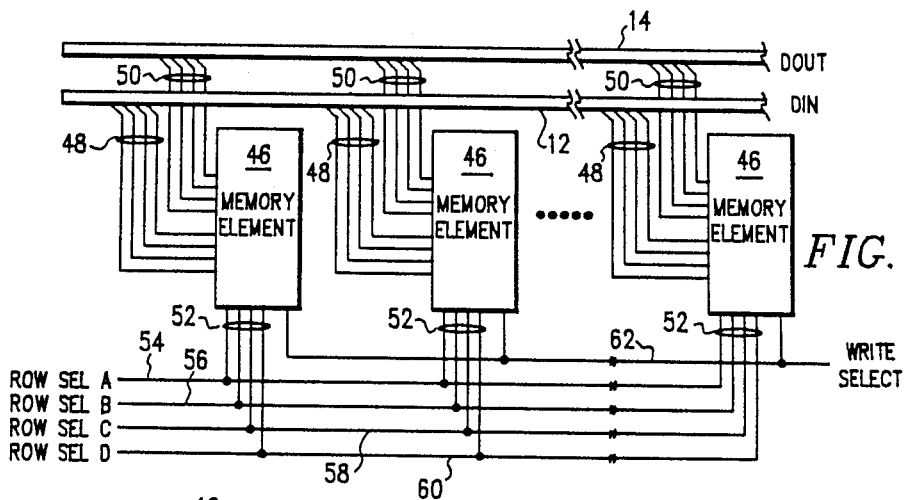
FIG. 2 illustrates a schematic diagram of one row of memory elements connected to the data buses and the row select signals.

Referring now to FIG. 2 there is illustrated a schematic block diagram of one row of memory elements. Each row is comprised of, in the preferred embodiment, eighteen memory elements 46. Each memory element 46 has the input thereof connected to the DIN data buses 12 through four separate data lines 48, one for each port A, B, C and D, the output thereof connected to the DOUT buses 14 through four separate data lines 50, one for each port A, B, C and D. Each of the separate data lines 48 and 50 represent a single bit of data. Each of the memory elements 46 has four row select input lines 52, each connected to one of the four row select lines 54, 56, 58 and 60 corresponding to ports A, B, C and D, respectively. In addition, each of the memory elements in a given row has an input for receiving a Write Select signal on a line 62.

In operation, each of the memory elements 46 in the accessed row is selected with the output thereof sensed and connected to the appropriate port of the DOUT buses 14. When a row select address selects a row of memory elements, it is selected for either port A, port B, port C or port D. The appropriate row select signal is applied to the selected one of the row select lines 54–60 such that the associated line for each of the memory elements 46 in the selected row is connected to the selected port A, B, C and D on the DOUT buses 14. If the Write Enable signal associated with the selected port is also present on the Write Enable lines 40, a Write Select signal for the selected row is input to the switch 66 for that selected row.

Figure 3:
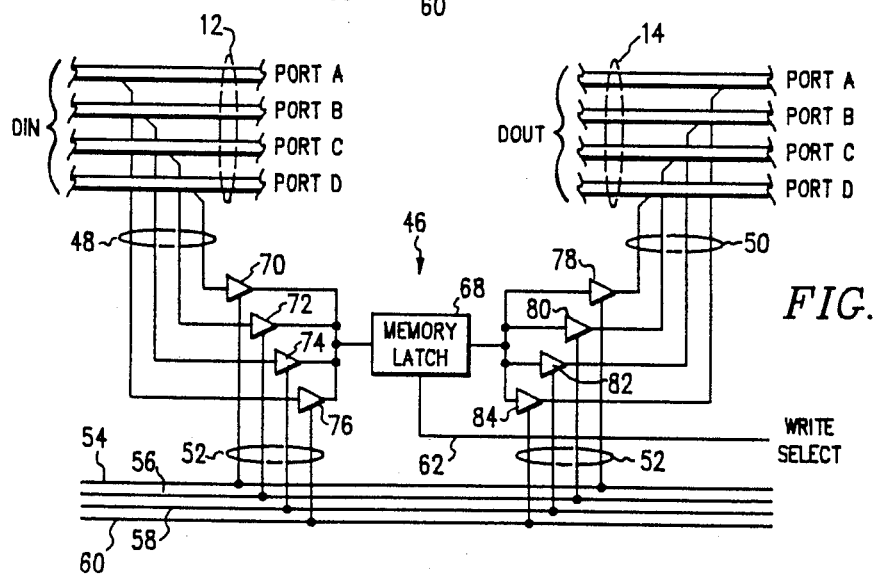
FIG. 3 illustrates a block diagram of one memory element.

Referring now to FIG. 3, there is illustrated a detailed schematic block diagram of each of the memory elements 46. Each of the memory elements 46 has a memory latch for storing a single bit of data. The memory latch 68, as will be described hereinbelow, utilizes a CMOS latch. The memory latch 68 is operable to store data in a static mode with data read from the memory latch 68 with current sensing logic and written to the latch with CMOS logic. The input to the memory latch 68 is connected to the output of four data input buffers 70, 72, 74 and 76, each corresponding respectively to one of the ports A, B, C and D. The inputs of the data input buffers 70–76 are connected to associated ones of the four lines 48, with each of the four lines 48 connected to associated ones of the DIN buses 12 for ports A, B, C and D. Each of the data input buffers 70–76 has an Enable input connected to a respective one of the row select lines 54–60 with row select line 54 connected to the Enable input on input buffer 70, row select line 56 connected to the Enable input on buffer 72, select line 58 connected to the enable input on data input buffer 74 and row select line 60 connected to the Enable input of data input buffer 76.

The output of memory latch 68 is connected to four data out buffers 78, 80, 82 and 84. The outputs of output buffers 78–84 are connected to associated ones of the lines 50 for interface with one of the ports A, B, C and D and the DOUT buses 14. In addition, each of the data out buffers 78–84 has an Enable input connected to a select one of the row select lines 54–60. The Enable input of output buffer 78 is connected to row select line 54, the Enable input of output buffer 80 is connected to row select line 56, the Enable input of output buffer 82 is connected to row select line 58 and the Enable input of output buffer 84 is connected to row select line 60.

In operation, one of the row select lines 54–60 is activated such that the associated one of the input buffers 70–76 and the associated one of the output buffers 78–84 are simultaneously activated to both connect the input data on the appropriate port of the DIN bus 12 to the memory latch 68 and also to connect the output of memory latch 68 to the associated port on the DOUT buses 14. If information is to be written to the memory latch 68, the Write Select signal for the given row is generated and the appropriate one of the input buffers 70-76 enabled. For memory cells selected only for a Read operation, the input one of the data lines 48 is set to a high impedance such that the logic state of the cell is not altered.

For a Read operation, any number of the output buffers 78-84 can be enabled. However, if one of the Write Enable signals is present on Write Enable lines 40, the Write Select signal will allow a Write operation. This would enable a corresponding number of the input buffers 70-76 on one memory cell which would give erroneous results. Therefore, reading of information in latch 68 to more than one port would not normally be associated with a Write operation from any of the input ports.

Each memory element 46 has associated therewith the circuitry necessary to select one or more of the ports to read to and simultaneously write from one port and read to the same port. The memory element requires one row select for each port for either a read or a write operation and data lines from each of the input and output buses for each port. A single Write Select signal is required on the periphery of the memory array 10 to perform the Write operation.

Referring now to FIG. 4, there is illustrated a detailed schematic diagram of the memory latch 68 and the input buffers 70-76 and output buffers 78-84, wherein like numerals refer to like parts in the various figures. The memory latch 68 is comprised of a CMOS latch which is connected between $V_{CC}$ and $V_{EE}$. A first P-channel transistor 90 has the drain thereof connected to $V_{CC}$ and the source thereof connected to a first sense node 92 and the gate thereof connected to a second sense node 94. An N-channel transistor 96 which is complimentary to the P-channel transistor 90 has the drain thereof connected to sense node 92, the source thereof connected to $V_{EE}$ and the gate thereof connected to sense node 94. A second P-channel transistor 98 has the drain thereof connected to $V_{CC}$ the source thereof connected to the sense node 94 and the gate thereof connected to a node 100. An N-channel transistor 102, which is complimentary to the P-channel transistor 98, has the drain thereof connected to the sense node 94, the source thereof connected to $V_{EE}$ and the gate thereof connected to the node 100. A Write Select N-channel transistor 104 is connected such that its source-drain path is connected between sense node 92 and node 100 and acts as a pass transistor. The gate of Write Select transistor 104 is connected to the Write Select signal on a line 62. Transistors 90 and 96 form one CMOS inverter with 98 and 102 forming a second CMOS inverter.

The buffers 70-76 are represented by N-channel pass transistors 70', 72', 74' and a 76' with each of the transistors 70'-76' having the gates thereof connected to the Write Enable input lines 54-60, respectively. In a similar manner, each of the buffers 78-84 is comprised of an N-channel pass transistor 78', 80', 82' and 84'. In the present circuit, each of the pass transistors 70-76' has a source-drain path thereof connected on one side to the sense node 92. In a similar manner, each of the pass transistors 78-84' has one end of the source-drain path connected to the sense node 94. Each of the transistors 78'-84' drives the data out bus 14 with corresponding NPN bipolar transistors 106, 108, 110 and 112. Transistors 110 and 112 have the gate thereof connected to the corresponding one of the N-channel transistors 78'-84', the collector thereof connected to $V_{CC}$ and the emitter thereof "Wired ORed" to a corresponding sense amp for each column, with each of the transistors 106-112 being part of a current sense amp for the associated column. It is important to note that each port for each memory cell has an associated bipolar transistor 106-112 to provide a low source impedance to the current sense amp. This bipolar transistor is integrated into the process with a technique known as "BICMOS".

The CMOS latch 68 with Write Select transistor 104 operates in the static mode in accordance with the operation of a conventional CMOS latch. However, in the Write mode, a Write Select signal is generated on line 62 only when both the cell is selected and one of the four Write Enable signals is present on the input to the memory. Conventionally, writing to a CMOS latch is achieved by forcing one of the sense nodes to a particular logic state at either a high voltage level or a low voltage level. Without the Write Select transistor 104, sense node 94 is forced from a low state to a high state or from a high state to a low state to change the logic state when the latch 68 is in the static mode.

When changing from a low logic state to a high logic state in the conventional CMOS latch, the N-channel transistor having a source drain connected between the sense node and $V_{EE}$ is turned on such that current is drawn therethrough. This represents a low logic state on that particular sense node. When the sense node is driven high, current is being drawn from the write circuitry through the N-channel transistor associated with the driven sense node until the gate of the N-channel transistor on the opposite side of the latch is turned on to pull the opposite sense node down. When the opposite sense node is pulled down, the gate of the N-channel transistor on the driven side is turned off. During this transition, additional current is pulled through the N-channel transistor. First, this requires the N-channel transistors in the latch to be larger to handle this additional current during a Write operation in addition to requiring the Write circuitry to provide a higher level of current. The only purpose of the Write circuitry is not to pull the driven sense node down when changing from a high logic state to a low logic state, but rather, to turn off the opposite side N-channel transistor. When pulling the driven sense node in a conventional CMOS latch from a high state to a low state, the opposite situation occurs, in that current is being pulled through the P-channel transistor with the P-channel transistor requiring a larger size device to handle this additional current.

In the present invention, the Write Select transistor 104 disconnects the gates of one complimentary pair of transistors from the opposite sense node during the Write operation. This prevents additional current being drawn through one of the P-channel transistors or sourced to one of the N-channel transistors. By disconnecting the node 100 from the sense node 92, the gate of P-channel transistor 98 and the gate of N-channel transistor 102 can be forced to either a high or a low state without incurring substantial current flow between the data input lines and node 100, other than that required to charge or discharge the small gate capacitance associated with transistors 98 and 102. This is to be compared with the case where current can flow through transistors 90 or 96 in the absence of Write Select transistor 104. Therefore, for a given size transistor, the Write speed will be increased.

By way of example, if node 94 is disposed at a high logic level and node 92 is disposed at a low logic level and it is desired to invert the logic state thereof, Write Select transistor 104 is first turned off and node 100 forced to a high voltage level. This turns on transistor 102 and it discharges sense node 94. When sense node 94 is discharged, this turns off N channel transistor 96 and turns on P channel transistor 90 to raise sense node 92 to a high level. It is important to note that there is no conductive path between node 100 and sense node 92, such that current cannot be conducted down through the source-drain path of transistor 96 when node 100 is raised from a low to a high logic level. Thereafter, Write Select transistor 104 is turned on to provide the "latched" state for the CMOS latch 68. It can be seen that the Write Select transistor 104 inherently increases the Write speed since unnecessary current need not be drawn through the pass transistors 70–76' and the peripheral circuitry driving the source-drain path of these transistors in order to change node 100 from a high to a low logic level or from a low to a high logic level since there is no conductive path to the opposite sense node. The Write Select transistor 104 in effect eliminates the crosscoupling during the Write operation. During the Write operation, the CMOS latch appears as two series connected inverters with the output stored on a capacitive node. After the Write operation, this output capacitive node is connected back to the input to complete the circuit and provide a latch.

Referring now to FIG. 5, there is illustrated a schematic diagram of the current sense amplifier operation. For a given column of memory cells, there is a signal column line 114 which comprises one of the lines in one of the data output buses 14. Each row of memory cells has one cell interfaced with the column line 114 through an NPN bipolar transistor 116. Bipolar transistors 116 are similar in function to bipolar transistors 106–112. Each of the bipolar transistors 116 has the base thereof connected to one end of the source-drain path of an MOS transistor 118. The other end of the source-drain path thereof is connected to a sense node on the associated memory cell (not shown). The emitters of each of the NPN transistors 116 are Wired ORed to the column line 114. Since only one cell in a given column is selected by the row select signal for a given port, only one of the transistors 116 is operable to conduct when the voltage on the associated sense node is at a high logic state.

In operation, transistor 116 conducts when the associated sense node is at a high logic state and the associated pass transistor 118 is conductive. In this state, current is supplied to the column line 114 and to a current source 120. Current source 120 is connected between the column line at one end thereof and $V_{EE}$. The other end of the column line is connected to the emitter of a threshold transistor 122 which has the collector thereof connected to a node 124 and the base thereof connected to a threshold voltage $V_{TH}$. Node 124 is connected through a resistor 126 to $V_{CC}$. Node 124 is also connected to the base of an NPN output drive transistor 128, which transistor has the collector thereof connected to $V_{CC}$ and the emitter thereof connected to the DOUT port.

When current flows through the emitter-collector path of transistor 116 to current source 120, the voltage of the emitter 116 is raised above the voltage $V_{TH}$, thus turning off transistor 122. When the voltage on the sense node associated with the selected cell is low, the associated transfer 116 is turned off, allowing current to be supplied by transistor 122 through resistor 126.

When transistor 122 conducts, current is drawn through resistor 126 to lower the voltage thereof to turn off transistor 128. When transistor 122 is off, node 124 is pulled high through resistor 126, turning on transistor 128. This appears on an output line 130 as the logic state. This is an ECL compatible signal. It can be seen from operation of the sense amp that the transistors 116 which are part of each memory cell in the system provides a low source impedance drive circuit, which low source impedance drives the column line 114. This is to be compared with a capacitive bit line which is driven directly by the pass transistors 118. This requires the memory cell itself to drive the high capacitance bit lines, which necessitates larger transistors. In the present circuit, the memory cells are buffered by low source impedance transistors 116 and the associated current sense amp, such that the size of the P-channel and N-channel transistors in the CMOS latch can be decreased due to the low current requirement. It can be seen that the N-channel and P-channel transistors are required only to drive the capacitance associated with the base of transistors 116 and not the capacitance associated with the bit line or column line 114.

Referring now to FIG. 6, there is illustrated a schematic diagram of an input ECL buffer for receiving one of the address lines $A_N$ for the row or the column address. The address signal $A_N$ is input to one input of an ECL gate which is comprised of two NPN bipolar transistors 130 and 132 with the base of transistor 130 connected to the signal line $A_N$ and the base of transistor 132 connected to a threshold voltage $V_{TH}$. The collectors of transistors 130 and 132 are connected to $V_{CC}$ and the emitters thereof are connected to a node 134. Node 134 is connected to a current source 136 to provide current for the input gate.

Node 134 is input to a second ECL gate which is comprised of two NPN transistors 138 and 140, the base of transistor 138 connected to node 134 and the base of transistor 140 connected to a threshold voltage $V_T$. The collector of transistor 130 is connected to $V_{CC}$ through a resistor 142 and the base thereof connected to a current source 144. Transistor 140 has the collector thereof connected to $V_{CC}$ through a resistor 146 and the emitter thereof connected to current source 144.

Node 134 is also connected to a third ECL gate which is comprised of two NPN transistors 148 and 150, the base of transistor 148 connected to node 134 and the base of transistor 150 connected to threshold voltage $V_T$. The collector of transistor 148 is connected through the emitter-collector path of an NPN transistor 152 to $V_{CC}$, and the collector of transistor 150 is connected through the emitter-collector path of an NPN transistor 154 to $V_{CC}$. Transistor 152 has the base thereof connected to the collector of transistor 138 and the transistor 154 has the base thereof connected to the collector of transistor 140. The collector of transistor 150 comprises the noninverted address signal $A_N$ and the collector of transistor 148 comprises the inverted form of the address signal $A_N$.

Referring now to FIG. 7, there is illustrated a schematic diagram of an ECL to CMOS translator which is connected to the output of the buffer of FIG. 6 which can then be connected to a conventional CMOS decoder circuit. This is utilized to convert the buffered ECL signals to CMOS voltage swings. Then noninverted input signal $A_N$ is connected to the gate of a P-channel transistor 162, the source of which is connected to $V_{CC}$ and the drain of which is connected to a node 164. The inverted address signal $A_N$ is input to the gate of a second P-channel transistor 166, the source of which is connected to $V_{CC}$ and the drain of which is connected to the source of an N-channel transistor 168. N-channel transistor 168 has the gate thereof connected to the source thereof and the drain connected to $V_{EE}$. The gate of N-channel transistor 168 is also connected to the gate of an N-channel transistor 70, the source of which is connected to node 164 and the drain of which is connected to $V_{EE}$. Node 164 comprises the output terminal.

In operation, the high voltage for $A_N$ will turn off P-channel transistor 162 with transistor 166 being turned on. This will raise the voltage on the gates of both transistors 168 and 170, thus turning transistor 170 on to lower the voltage on node 164 to $V_{EE}$. When the address signal $A_N$ is low, transistor 162 is conducting and transistor 166 is turned off. This will raise the voltage on node 164 to $V_{CC}$. Therefore, the translator of FIG. 8 provides a rail-to-rail voltage swing for the output voltage.

Referring now to FIG. 8, there is illustrated a schematic diagram of a BICMOS inverter with a three state output which is utilized for the data input. The circuit of FIG. 8 allows a high impedance to be placed on the data Write column lines 12 when a Write function is not selected for a particular port and selected memory cell. The BICMOS inverter includes a CMOS inverter having a P-channel transistor 170 and an N-channel transistor 172 with an input node 174 and an output node 176. The CMOS inverter is connected between $V_{CC}$ and a lower offset voltage. This voltage is equal to $V_{CC}-V_D$, where $V_D$ is equal to the voltage of one diode drop. The node 176 is connected to the base of an NPN bipolar transistor 178 which has the collector thereof connected to $V_{CC}$ and the emitter thereof connected to an output terminal 180. The NPN transistor 178 functions as a pull up transistor. A second bipolar NPN transistor 182 has the collector thereof connected to the output node 180 and the emitter thereof connected to the offset voltage and functions as a pull down transistor. The base of NPN transistor 182 is connected to one end of the source-drain path of an N-channel MOS transistor 184, which has the other end of the source-drain path thereof connected to the offset voltage. The gate of transistor 184 is connected to the node 176. An N-channel transistor 186 has the source-drain path connected in series with the source-drain path of an N-channel transistor 187 with the series connected devices 186 and 187 connected across the collector-base of transistor 182. The gate of transistor 187 is connected to the input terminal 174 and the gate of transistor 187 is connected to WE. Two Write Enable transistors 188 and 190 are provided with the gates thereof connected to the inverted Write Enable signal to provide the three state function. The source-drain path of the transistor 188 is connected between the base of transistor 182 and the offset voltage, and the transistor 190 has the source-drain path thereof connected between the base of transistor 178 and the offset voltage.

In operation, transistors 188 and 190 function to maintain transistors 178 and 182 in an Off condition such that they do not conduct charge to the output terminal 180 or away from the output terminal 180. This is a conventional BICMOS gate which receives an ECL voltage and outputs an ECL voltage. This ECL voltage is input to an ECL to CMOS translator similar to that described above in FIG. 7 to provide a CMOS output voltage swing on the column Write lines 12.

Referring now to FIG. 9, there is illustrated a schematic diagram of the Write Select logic for one row. Each of the row select signals SELECT 1, 2, 3 and 4 are respectively connected to an input of AND gates 260, 262, 264 and 268. The other input of each of the AND gates 260-268 is connected to the Write Enable signals WE A, WE B, WE C and WE D, respectively. The outputs of AND gates 260-268 are each connected to one input of a four input OR gate 270. The output of OR gate 270 provides the Write Select function for the selected row. For a given row, the row select signal is ANDed with the Write Enable signal. When both signals are present, this provides an output on the respective one of the AND gates 260-268 and the Write Select signal is generated on the output of the OR gate 270. It can be seen from this logic that if more than two Row Select signals are present and any of the associated Write Enable signals, this will provide a Write Select signal. This will be a disadvantage in that data from two DATA In buses 12 would be connected to a given memory element. Therefore, it would be desirable not to have a Write Enable signal present when data is being read from a given memory element to two or more separate output ports.

In summary, there has been provided a fast write hybrid memory cell which utilizes two CMOS inverters connected in a latched configuration. The output of one inverter is connected to the input of the other inverter in the static mode. During a Write operation, the output of one inverter is disconnected from the input of the other inverter and the input of the first inverter forced to a predetermined logic state. The inverters are then reconnected to provide the latched state.

Although the preferred embodiment has been described in detail, it should be understood the various changes, substitutions and alternations can be made therein without departing from the spirit and scope of the invention as defined by the appended claims.

What is claimed is:

1. A multiport memory cell comprising:
   a first CMOS inverter having an input and an output, the output of said first CMOS inverter comprising a first sense node coupled to at least one output buffer;
   a second CMOS inverter having an input and an output, the output of said second CMOS inverter comprising a second sense node coupled to at least one input buffer;
   said first CMOS inverter having the output thereof connected to the input of said second CMOS inverter;
   write connect circuitry connected between the output of said second inverter and the input of said first inverter to provide a selectively conductive path therebetween, said selectively conductive path being nonconductive in response to the presence of a write select signal and conductive in the absence thereof;
   means for interfacing the input of said first CMOS inverter with input data in the presence of said write select signal to force the logic state on the output of said second inverter to a predetermined logic state; and
   means for interfacing said first sense node to external read circuitry for a read operation.

2. The memory cell of claim 1 wherein said first sense node comprises an output node for the read operation.

3. The memory cell of claim 1 wherein said write connect circuitry comprises a CMOS pass transistor having the source-drain path thereof connected between the output of said second inverter and the input of said first inverter and the gate thereof connected to said write select signal.

4. The memory cell of claim 1 wherein said first and second CMOS inverters each comprise:
- a P-channel transistor having a source-drain path connected between a high reference voltage and the associated one of said first and second sense nodes; and
- an N-channel MOS transistor having a source-drain path connected between the associated one of said first and second sense nodes and a low reference voltage;
- said P-channel and N-channel transistors having gates commonly connected and providing the input for the respective one of said first and second inverters;
- the interconnection of the source-drain paths of said N- and P- channel transistors comprising the output.

5. A multiport memory array comprising:
- a plurality of input/output ports, each port having an input data bus and an output data bus;
- address circuitry for receiving and decoding port select addresses associated with each port and each defining a memory location for an associated port and outputting a memory location select signal for the associated port;
- write enable circuitry for receiving an external write enable signal for each port and outputting a write select signal to an associated one of said memory locations when both the memory location select signal for a particular memory location associated with both a port and a write enable signal for the associated port are present; and
- a plurality of memory cells arranged in rows and columns for storing data and each defining a memory location, each of said memory cells comprising:
- a CMOS latch having first and second CMOS inverters with the output of said first inverter connected to the input of said second inverter and to said output ports via a first sensing node and the output of said second inverter connected to the input of said first inverter and to said input ports via a second sensing node coupled to switch circuitry operable to selectively disconnect the output of said second inverter from the input of said first inverter in the presence of said write select signal associated with said memory location, at least one write buffer associated with each memory cell for interfacing with one of said input ports in said memory cell and the input of said first CMOS inverter in said memory cell, said write buffers for inputting data from said input port to said memory cell and selected by said memory location select signal output by said address circuitry for the associated port,
- write inhibit circuitry for preventing data from being input to said memory cell by said write buffers to change the state thereof unless said write buffers are selected and an associated write select signal is present for the associated memory cell, and
- at least one read buffer associated with each memory cell for interfacing with at least one of said output ports and for sensing data stored in said associated memory cell in response to receiving a memory location select signal for the associated cell and associated port from said address circuitry.

6. The multiport memory of claim 5 wherein said switch circuitry in each of said memory cells comprises an MOS transistor having the source-drain path thereof connected between the output of said second inverter and the input of said first inverter.

7. The multiport memory of claim 5 wherein said first and second inverters each comprise a CMOS inverter with a P-channel transistor having a source-drain path connected between a high reference voltage and a sense node, the sense node associated with each of said first and second inverters, and an N-channel transistor having a source-drain path connected between said associated sense node and a low reference voltage, the gates of said P-channel and N-channel transistors commonly connected to provide the input of the respective one of said first and second inverters.

8. The multiport memory of claim 5 wherein said write buffers for an associated cell and each one of said ports comprises an MOS pass transistor.

9. The multiport memory of claim 5 wherein said select addresses are row addresses for selecting an entire row of said memory cells, and all of said write buffers and said read buffers for associated ports are commonly selected.

10. The multiport memory of claim 5 wherein said write enable circuitry comprises a logic circuit for receiving said memory location select signal and said write enable signal for each port and outputting a write select signal to each of the rows of said memory elements corresponding to the select row such that all of the memory cells in the selected row are written to when the write enable signal for any of the ports are present.

11. A method for writing to a static CMOS memory cell having a first CMOS inverter with the output thereof connected to the input of a second CMOS inverter with the output of the second CMOS inverter connected to the input of the first CMOS inverter, comprising:
- selectively disconnecting the output of the second CMOS inverter from the input of the first CMOS inverter before a write operation;
- forcing the input of the first CMOS inverter to a predetermined logic state during said write operation; and
- reconnecting the output of the second CMOS inverter to the input of the first CMOS inverter after said write operation.

12. The method of claim 11 wherein the step of selectively disconnecting the output of the second CMOS inverter from the input of the first CMOS inverter comprises:
- disposing a switch between the output of the second CMOS inverter and the input of the first CMOS inverter;
- the switch being closed for a normal static mode;
- activating the switch to an open and nonconducting state in the presence of a Write select signal associated with the memory cell; and
- activating the switch to a conducting state in the absence of the write select signal.

* * * * *